United States Patent
Corpuz et al.

(10) Patent No.: US 12,525,976 B2
(45) Date of Patent: Jan. 13, 2026

(54) ACTIVE SWITCH LEAKAGE CURRENT DIVERSION

(71) Applicant: Advanced Energy Industries, Inc., Denver, CO (US)

(72) Inventors: Mark Corpuz, Cork (IE); Robert Ryan, Cork (IE); Jack William Bermingham, Kinsdale (IE); Andrejs Gasilovs, Midleton (IE)

(73) Assignee: Advanced Energy Industries, Inc., Denver, CO (US)

( * ) Notice: Subject to any disclaimer, the term of this patent is extended or adjusted under 35 U.S.C. 154(b) by 47 days.

(21) Appl. No.: 18/329,521

(22) Filed: Jun. 5, 2023

(65) Prior Publication Data

US 2024/0405769 A1 Dec. 5, 2024

(51) Int. Cl.
*H03K 17/693* (2006.01)
*H03K 17/00* (2006.01)
*H03K 17/689* (2006.01)
*H03K 17/691* (2006.01)

(52) U.S. Cl.
CPC ......... *H03K 17/693* (2013.01); *H03K 17/005* (2013.01); *H03K 17/689* (2013.01); *H03K 17/691* (2013.01)

(58) Field of Classification Search
None
See application file for complete search history.

(56) References Cited

U.S. PATENT DOCUMENTS

| | | | | |
|---|---|---|---|---|
| 3,215,859 A | * | 11/1965 | Sorchych | H03K 17/04 330/277 |
| 4,595,847 A | * | 6/1986 | Weir | H03K 17/6874 327/434 |
| 4,659,942 A | * | 4/1987 | Volp | G06F 1/30 307/42 |
| 4,808,859 A | * | 2/1989 | Even-or | H03K 17/162 327/382 |
| 5,682,050 A | * | 10/1997 | Williams | H01L 29/7802 327/434 |
| 6,258,592 B1 | | 7/2001 | Ragsdale et al. | |
| 6,683,393 B2 | * | 1/2004 | Lewis | H02M 5/293 307/115 |
| 6,917,192 B1 | * | 7/2005 | Xin-LeBlanc | H03L 7/0895 327/148 |
| 7,268,613 B2 | * | 9/2007 | Cranford, Jr. | H03K 17/161 327/427 |
| 7,576,958 B2 | | 8/2009 | Bergh | |

(Continued)

OTHER PUBLICATIONS

PCT, International Search Report and Written Opinion issued in PCT/US2024/031480, Aug. 28, 2024, 20 pages.

*Primary Examiner* — Thomas J. Hiltunen
(74) *Attorney, Agent, or Firm* — NOD Law PC

(57) ABSTRACT

A power supply component comprising a supply node to provide a supply voltage and a supply line to provide a source voltage. The supply line comprising a source node that has a source voltage, and the supply line includes a supply line switch coupled between the source node and the supply node, wherein the supply line switch couples the source voltage to the supply node when the supply line switch is closed. A current diversion component diverts leakage current away from one or both of the source node and the supply node when the supply line switch is open.

17 Claims, 11 Drawing Sheets

(56) References Cited

U.S. PATENT DOCUMENTS

| | | | |
|---|---|---|---|
| 8,724,373 B2* | 5/2014 | Garg | G11C 8/16 |
| | | | 365/230.06 |
| 8,981,839 B2* | 3/2015 | Kay | G06F 1/263 |
| | | | 307/43 |
| 9,048,756 B2 | 6/2015 | Dong | |
| 9,099,945 B2 | 8/2015 | Sakai | |
| 9,401,659 B2* | 7/2016 | Lei | A61B 8/4405 |
| 9,520,869 B2* | 12/2016 | Fiedorow | H03K 17/162 |
| 9,871,505 B2* | 1/2018 | Desel | H03K 17/6874 |
| 10,171,072 B2* | 1/2019 | Ko | A61B 8/469 |
| 11,444,550 B1* | 9/2022 | Jelinek | H02J 7/35 |
| 2011/0303534 A1 | 12/2011 | Yanagiya | |
| 2022/0321016 A1* | 10/2022 | Khaligh | H02M 3/33561 |
| 2023/0030927 A1 | 2/2023 | Dorf et al. | |
| 2024/0396544 A1* | 11/2024 | Wu | H03K 19/018521 |

* cited by examiner

ACTIVE SWITCH LEAKAGE CURRENT DIVERSION

FIELD OF THE DISCLOSURE

This disclosure relates generally to power supplies. More particularly, this disclosure relates to leakage current management in a power supply.

BACKGROUND

A pulsed electric field (PEF) generator is a type of power supply that is configured to generate suitable output waveshapes for a wide array of applications. Generally, the PEF generator produces short, intense bursts of electric field pulses that are used to apply a high-voltage electric field to various substances or materials for a brief period. PEF generators have many possible applications. They may be used in the food industry to inactivate bacteria, yeasts, and molds in food products, thus extending their shelf life. They may be used in water and wastewater treatment to break down pollutants. They may be used in biotechnology to help transfer genes into cells. These are but a few of many possible applications of PEF generators.

Another example of the possible uses of a PEF generator is in medical applications. In one such application, a PEF generator is deployed in a medical device known as an electroporator for use in cancer treatments. The PEF generator of the electroporator generates pulsed output waveforms with amplitudes ranging from 5V to 3 kV depending on the treatment. The pulsed voltage waveforms generated by the electroporator are applied to cancer tumors to induce the biological phenomenon of electroporation and ultimately induce tumor death. PEF generators of this nature can be rated for extremely high peak power levels as high as 150 kW.

The range of voltages and high power associated with PEF generators create many challenges to providing clean and safe power output.

SUMMARY

One aspect of this disclosure is a power supply component comprising a supply node to provide a supply voltage and a supply line, wherein the supply line includes a source node that has a source voltage, a supply line switch coupled between the source node and the supply node, wherein the supply line switch couples the source voltage to the supply node when the supply line switch is closed, and a current diversion component to divert leakage current away from one or both of the source node and the supply node when the supply line switch is open.

Another aspect of this disclosure is a method comprising coupling, via a switch of a supply line, a source voltage to a supply node to apply the source voltage to the supply node, opening the switch to decouple the source voltage from the supply node, and diverting, while the switch is open, leakage current away from one or both of the source node and the supply node.

These and other aspects of this disclosure are depicted in the accompanying drawings and description and will be apparent based thereon.

DETAILED DESCRIPTION

Figure 1:
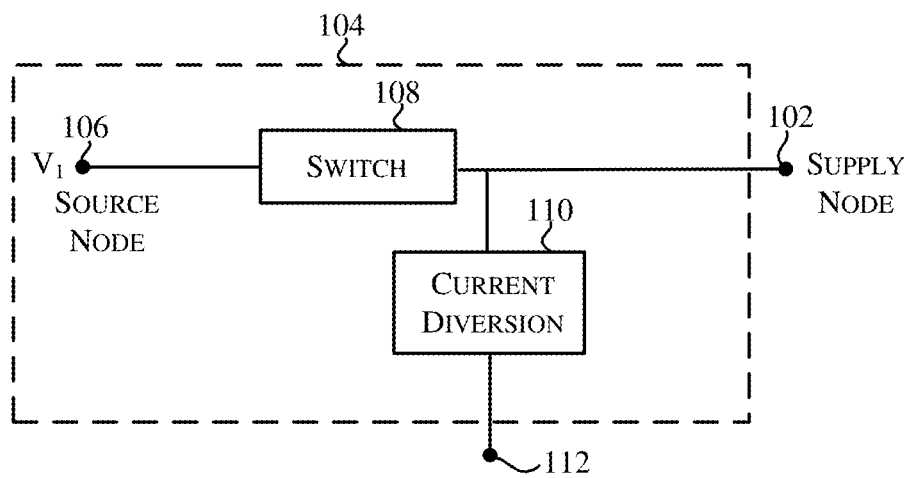
FIG. 1 is a block diagram depicting an example of a power supply component.

Referring first to FIG. 1, shown is a block diagram depicting an example power supply component. As shown, a supply node 102 is provided to apply a supply voltage, and the supply voltage may be used within a power supply to provide a desired voltage. Also shown is a supply line 104 comprising a source node 106 that has a source voltage, V1, and a supply line switch 108 that is coupled between the source node 106 and the supply node 102. The supply line switch 108 couples the source voltage to the supply node 102 when the supply line switch 108 is closed. In addition, supply line 104 includes a current diversion component 110 to divert leakage current away from one or both of the source node 106 and the supply node 102 when the supply line switch 108 is open. As shown in FIG. 1, the current diversion component 110 may be coupled between the supply node 102 and a diversion node 112. The diversion node 112 may couple to a ground terminal or another node (e.g., that is at a lower potential than the supply node 102).

Figure 2:
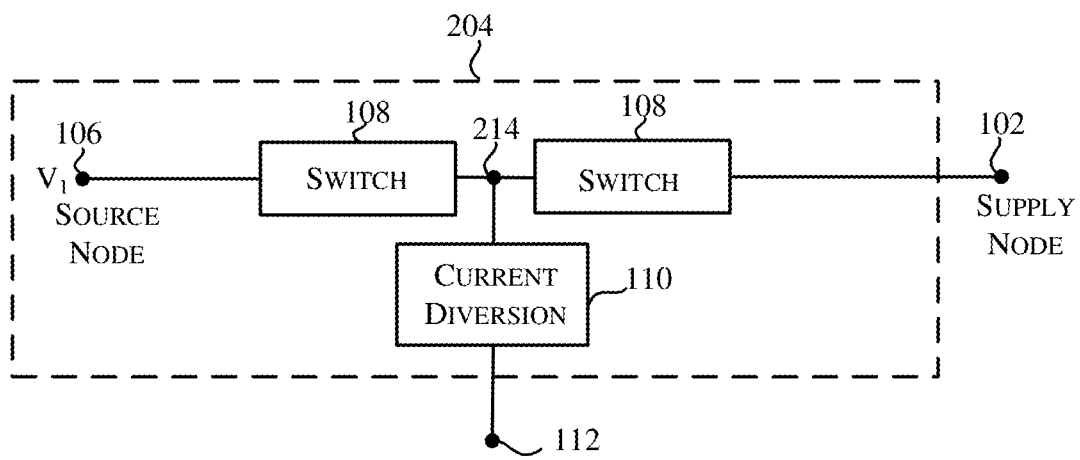
FIG. 2 is a block diagram depicting another example of a power supply component.

Referring to FIG. 2, shown is a block diagram depicting another example of a power supply component. As shown, a supply line switch comprises a collection of two or more series switches 108 and the current diversion component 110 is coupled to a common node 214 between the two series switches 108. In this variation, the current diversion component 110 is coupled between the common node 214 (between two series switches) and the diversion terminal 112. The series switches 108 may be realized by semiconductor switches such as, for example and without limitation, field effect transistors and/or insulated gate bipolar transistors.

Figure 3:
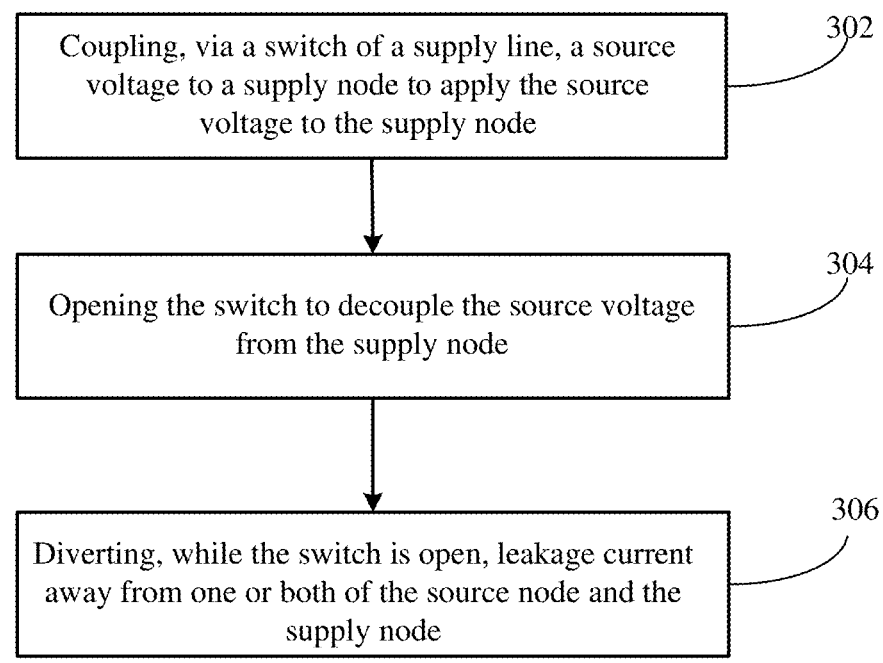
FIG. 3 is a flowchart depicting a method that may be traversed in connection with embodiments disclosed herein.

While referring to FIGS. 1 and 2, simultaneous reference is made to FIG. 3, which is a flowchart depicting a method that may be traversed in connection with the power supply components depicted in FIG. 1. As shown, a source voltage, V1, is coupled via a supply line switch (that may include one or multiple series switches 108) to a supply node 102 to apply the source voltage, V1, to the supply node 102 (Block 302). In operation, the supply line switch is opened to decouple the source voltage from the supply node 102 (Block 304), and while the supply line switch is open, leakage current is diverted away (via the current diversion component) from one or both of the source node 106 and the supply node 102 (Block 306).

As shown in FIG. 2, the coupling at Block 302 may include coupling the source voltage to the supply node 102 via at least two series switches 108, and in these variations, the diverting at Block 306 may include diverting the leakage current away from a node 214 between the switches 108 to the diversion node 112. As discussed above, the leakage current may be diverted away from node 214 between two of the switches 108 to a ground terminal.

The source voltage that is applied to supply node 102 may be used for a variety of purposes. For example, as described further herein, the selected source voltage may be used as a rail voltage that is applied to a bridge circuit, and the bridge circuit may be used to create a time varying waveform (such as a pulsed voltage), wherein a magnitude of the pulsed voltage is controlled by selecting the source voltage from among the at least two source voltages.

Figure 4:
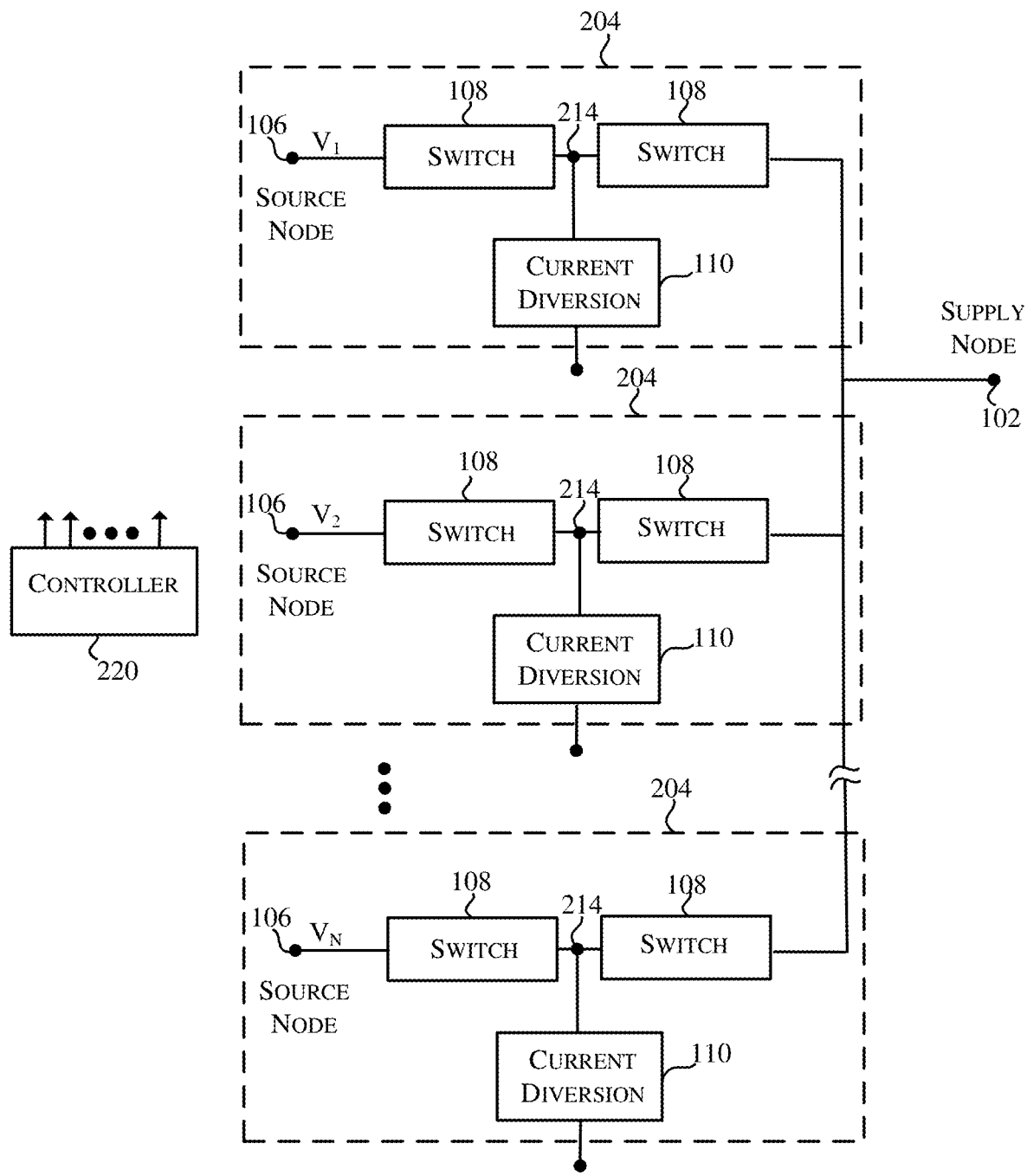
FIG. 4 is a block diagram depicting yet another example of a power supply component.

Referring to FIG. 4, shown is an example power supply topology utilizing the power supply components depicted in FIG. 2. As shown, the power supply topology includes at least two supply lines 204 coupled to the supply node 102, and each of the supply lines 204 is configured to selectively provide a corresponding source voltage to the supply node 102. As depicted, each supply line 204 comprises a corresponding source node 106 that has a corresponding source voltage (V1, V2, . . . . VN) and each supply line 204 also includes a corresponding supply line switch (which may include two or more series switches 108) coupled between the corresponding source node and the supply node, wherein the corresponding supply line switch couples the corresponding source voltage 106 to the supply node 102 when the corresponding supply line switch is closed. In addition, each supply line 204 includes a corresponding current diversion component 110 to divert leakage current away from either the corresponding source node 106 or away from the supply node 102 when the corresponding supply line switch is open. Also shown is a controller 220 that may be used to control one or more aspects of the power supply components depicted in FIG. 4. For example, the controller 220 may enable a selection of one of the supply lines 204 to apply power to the supply node 102. The controller may also be a part of a feedback system and/or readback system that receives signals indicative of one or more power-related parameters, such as, without limitation, voltage, current, phase, and frequency. The controller 220 may also be used in other power supply variations that utilize the power supply topology depicted in FIG. 4.

Figure 5:
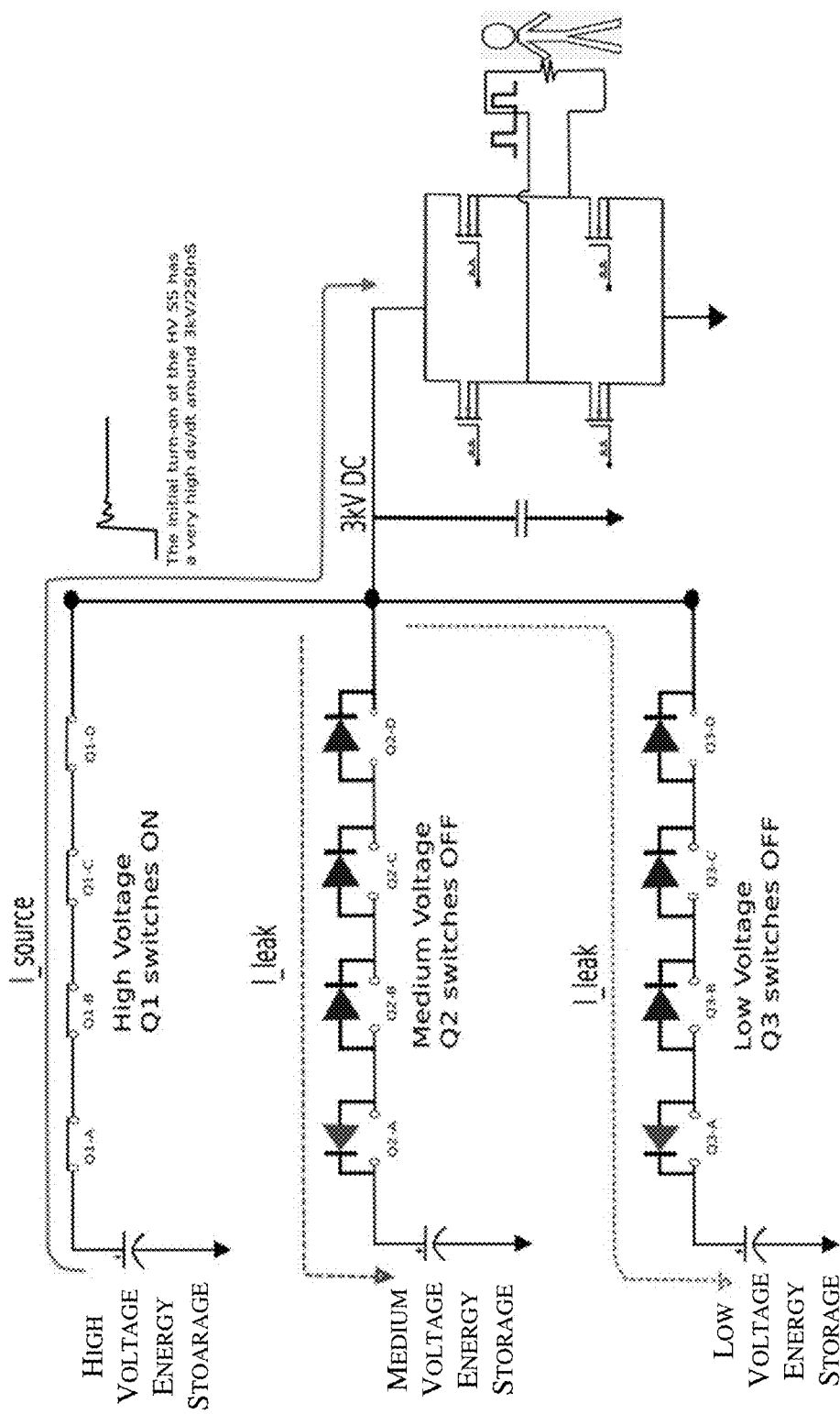
FIG. 5 depicts a power supply topology and examples of leakage currents.
Figure 6:
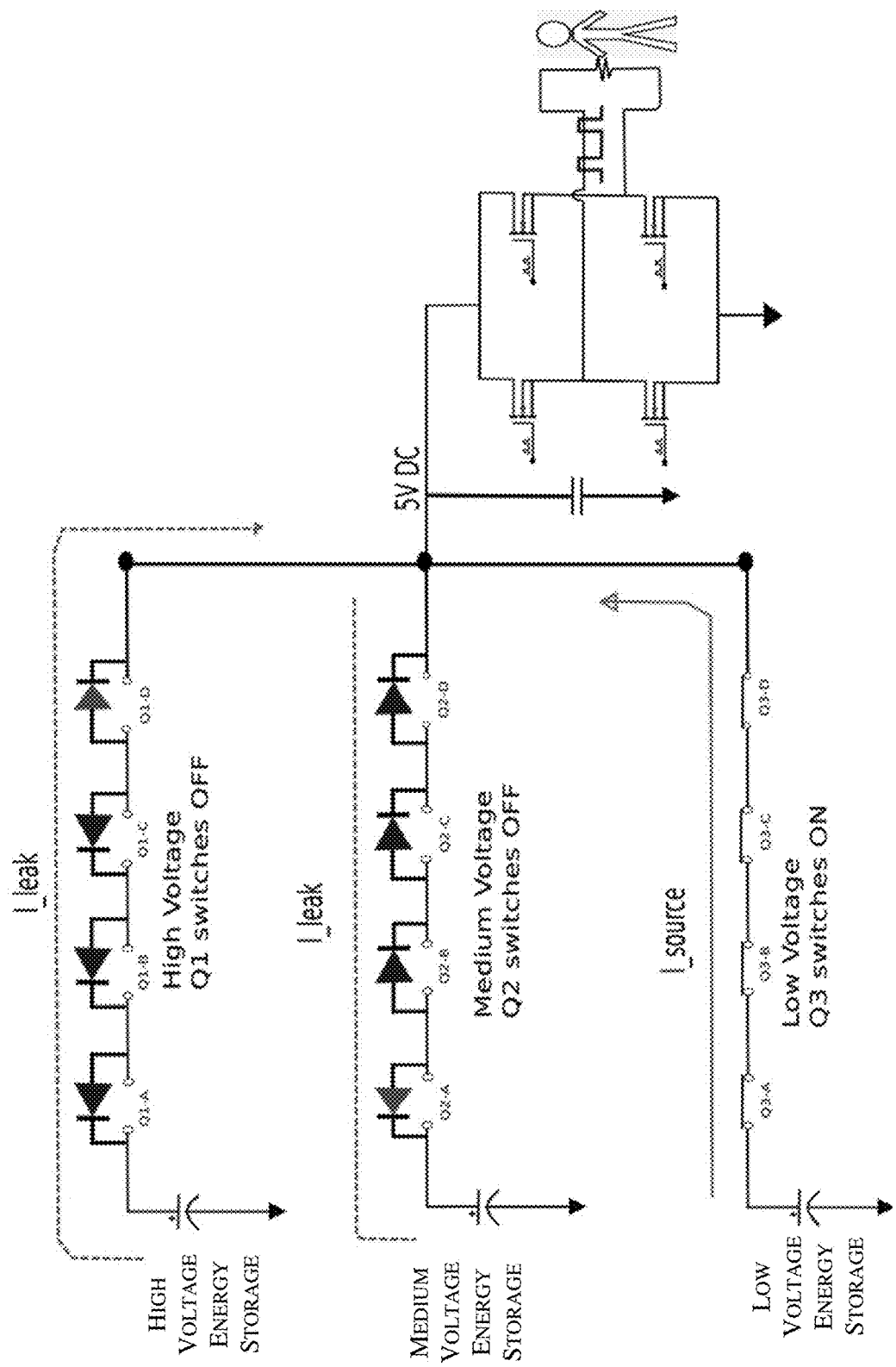
FIG. 6 depicts the power supply topology of FIG. 5 and additional examples of leakage currents.

The utilization of the current diversion components 110 in connection with the multiple supply lines 204 depicted in FIG. 4 mitigates against leakage current to enable various power supply implementations. Referring to FIGS. 5 and 6 for example, shown are examples of leakage current problems in the context of a pulsed electric field (PEF) power supply. As shown in FIGS. 5 and 6, the PEF includes a high voltage supply, a medium voltage supply and a low voltage supply. As shown, for energy storage, a capacitor may be utilized for each of the high voltage supply, the medium voltage supply and the low voltage supply. In operation, it is desired to have a single one of the voltage supplies provide power to a bridge circuit while the other two supplies are decoupled from the bridge circuit. More specifically, it would be desirable to have each supply operate in an isolated manner from the other supplies so the voltage, and corresponding leakage current, produced from one voltage supply does not adversely affect the other supplies. But problematically, leakage current in the implementations depicted in FIGS. 5 and 6 produces problems.

Referring to FIG. 5 for example, when the high voltage of the high voltage supply is coupled to the bridge circuit, undesirable leakage current flows through semiconductor switches (e.g., field effect transistors (FETS)) toward the medium voltage and low voltage capacitors. These leakage currents will have a detrimental effect because of the presence of the high output voltage, and in some modes of operation, very high rate of change (dv/dt) of the applied voltage that exacerbates the leakage current. The immediate effects of the leakage current may be pulse inaccuracy (e.g., leakage current from the high voltage will influence the voltage level of the medium voltage and the low voltage) and there may be potential damage to internal circuits, e.g., the low voltage supply line output circuit. In the mode of operation depicted in FIG. 6, the low voltage switches are closed to apply the low voltage to the bridge circuit, but leakage current from the high voltage supply detrimentally flows to the bridge circuit and to the medium voltage supply.

Figure 7:
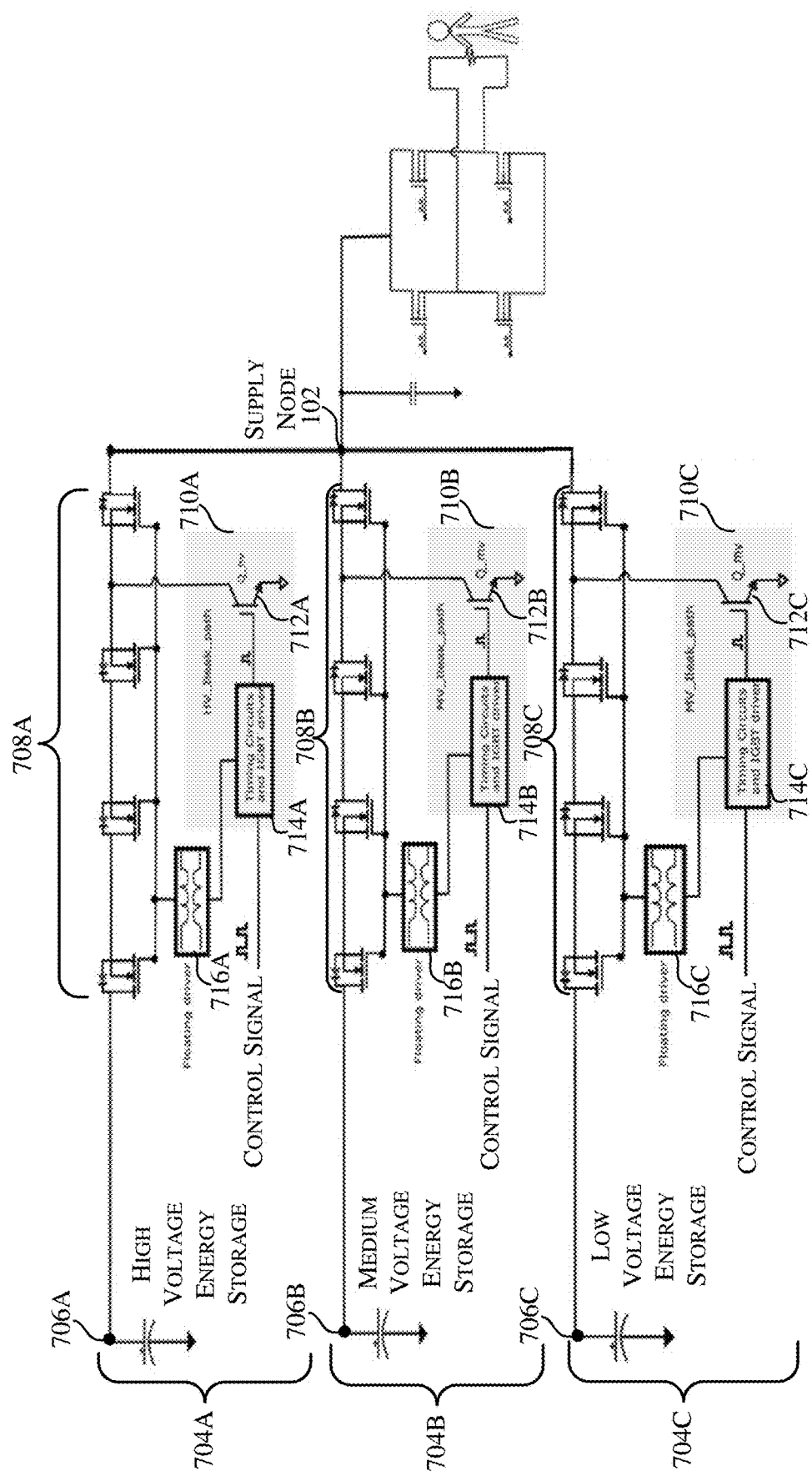
FIG. 7 depicts a power supply utilizing examples of the power supply components depicted in FIGS. 1 and 2.

Referring to FIG. 7, shown is a pulsed electric field (PEF) power supply that incorporates an example, without limitation, of an approach to implementing and utilizing the current diversion approaches disclosed herein. As shown in this example, there are three supply lines: a high voltage supply line 704A, a medium voltage supply line 704B, and a low voltage supply line 704C. As depicted, each of the supply lines includes a source node (706A, 706B, 706C) coupled to an energy storage device (e.g., a capacitor) that has a source voltage, and a supply line switch (708A, 708B, 708C) is coupled between the source node (706A, 706B, 706C) and the supply node 102, wherein the supply line switch includes at least two semiconductor switches arranged in series. In addition, each supply line (704A, 704B, 704C) also includes a current diversion component (710A, 710B, 710C). For example, the high voltage supply line includes a corresponding source node 706A that has a corresponding source voltage (that may be a relatively high voltage applied by a high voltage energy storage component, such as, for example and without limitation, a capacitor) and the high voltage supply line 704A also includes a corresponding supply line switch 708A coupled between the corresponding source node 706A and the supply node 102, wherein the corresponding supply line switch 708A couples the corresponding source voltage (at source node 706A) to the supply node 102 when the corresponding supply line switch 708A is closed. In addition, the high voltage supply line 704A includes a corresponding current diversion component 710A to divert leakage current away from either the corresponding source node 706A or away from the supply node 102 when the corresponding supply line switch 708A is open.

As shown, each current diversion component (710A, 710B, 710C) is configured to receive a control signal (e.g., from the controller 220 or other control circuitry), and in turn, the current diversion component both controls the supply line switch (708A, 708B, 708C) and a corresponding diversion switch (712A, 712B, 712C). The current diversion switch (712A, 712B, 712C), may be realized for example and without limitation, by an insulated gate bipolar transistor. As shown, timing-and-driver circuitry (714A, 714B, 714C) may be used to send a diversion-switch signal to close the current diversion switch (712A, 712B, 712C) when a series-switch signal is sent to open the series switch (708A, 708B, 708C). Conversely, the timing-and-driver circuitry (714A, 714B, 714C) sends the diversion-switch signal to open the current diversion switch (712A, 712B, 712C) when the series-switch signal closes the series switch (708A, 708B, 708C). As discussed further herein, the timing-and-driver circuitry (714A, 714B, 714C) controls the timing of the series-switch signal and the diversion-switch signal to prevent undesirable current paths. As shown, the series-switch signal to open/close the series switch (708A, 708B, 708C) may be sent via a floating driver (716A, 716B, 716C), which propagates the series-switch signal to open/close the series switch while galvanically isolating the timing-and-driver circuitry (714A, 714B, 714C) from the series switch (708A, 708B, 708C).

Figure 8:
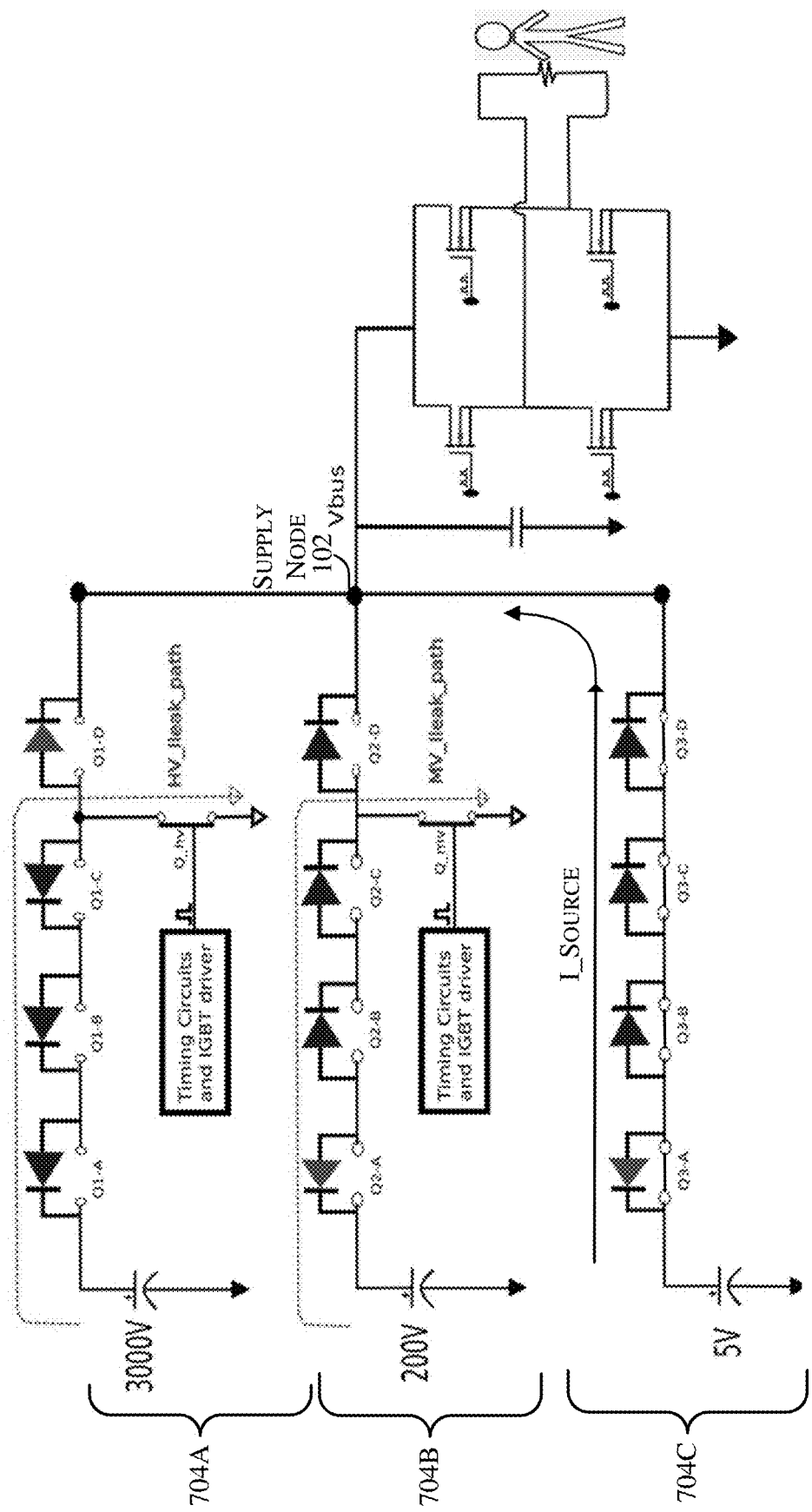
FIG. 8 is a simplified depiction of the power supply of FIG. 7 depicting aspects of current diversion.

Referring to FIG. 8, shown is a simplified representation of the pulsed electric field (PEF) power supply of FIG. 7 in a mode of operation where the supply line switch (comprising a collection of series switches) of the low voltage supply line 704C is closed. As shown, leakage current of the high voltage supply line 704A and leakage current of the medium voltage power supply is diverted away from supply node 102. In addition, leakage current that would ordinarily originate from the high voltage supply line 704A and flow through the medium voltage supply line 704B (to the medium voltage energy storage) is diverted before it ever reaches the supply node 102.

Figure 9:
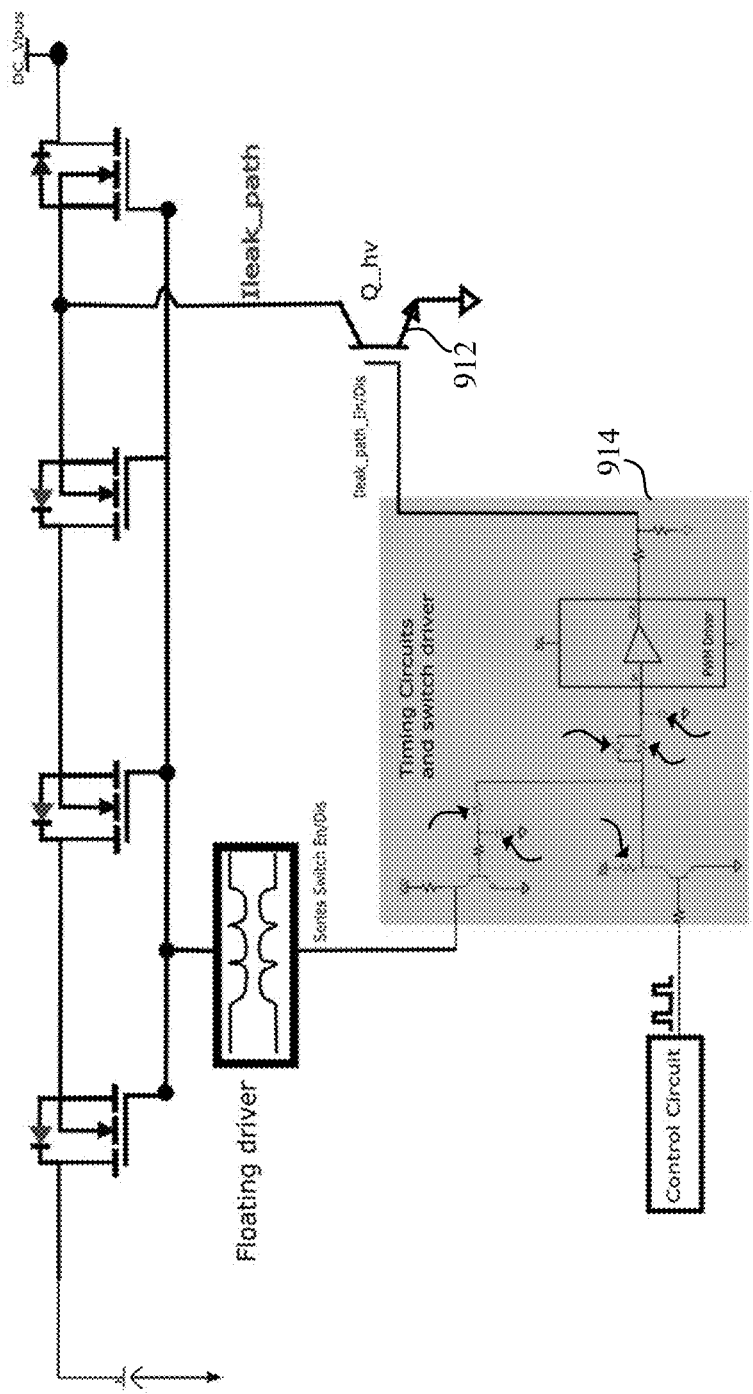
FIG. 9 depicts an example of a current diversion component.

Referring next to FIG. 9, shown is an example of timing-and-driver circuitry 914 that may be utilized to activate a current diversion path in the current diversion component when the series switch(es) are open. While referring to FIG. 9, simultaneous reference is made to FIG. 10, which is a timing diagram depicting a timing of the series-switch signal (series switch En/Dis), the diversion-switch signal (Ileak_path_En/Dis) signal, and the control circuit signal (e.g., from controller 220 or other control circuitry). As shown, responsive to the control circuit providing a signal to open the series switch, there is a delay of T1_delay before the diversion-switch signal (Ileak_path_En/Dis) is sent to current diversion switch (transistor Q_hv) that causes the current-diversion switch to close to provide a leakage current path (Ileak_path).

Figure 10:
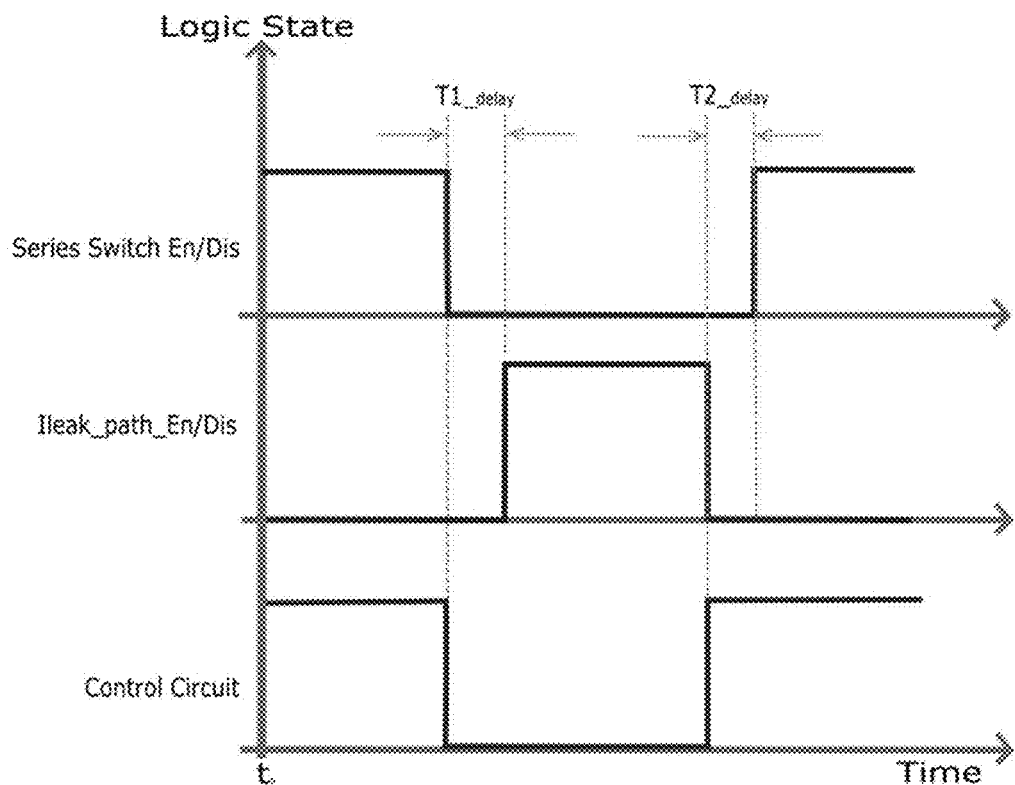
FIG. 10 is a timing diagram illustrating operation of the current diversion component of FIG. 9.

In addition, FIG. 10 depicts a delay (T2_delay) that represents the delay between the opening of the current diversion switch and the closing of the series switch. As shown in FIG. 9, timing components (pointed out by arrows) effectuate the inductive-resistive-capacitance (LRC) timing aspects of the timing-and-driver circuitry 914. One of ordinary skill in the art is readily able, in view of this disclosure, to size each of the timing components to achieve desired values for T1_delay and T2_delay. Also shown in the timing-and-driver circuitry 914 is a driver that provides a signal, as one of ordinary skill in the art will readily appreciate, with a magnitude the is able to open and close the current diversion switch 912. It should be recognized that the depicted timing-and-driver circuitry 914 and design of the current diversion components disclosed herein are only examples and that alternative designs may be utilized to open/close the series switch and close/open the current diversion switch.

Figure 11:
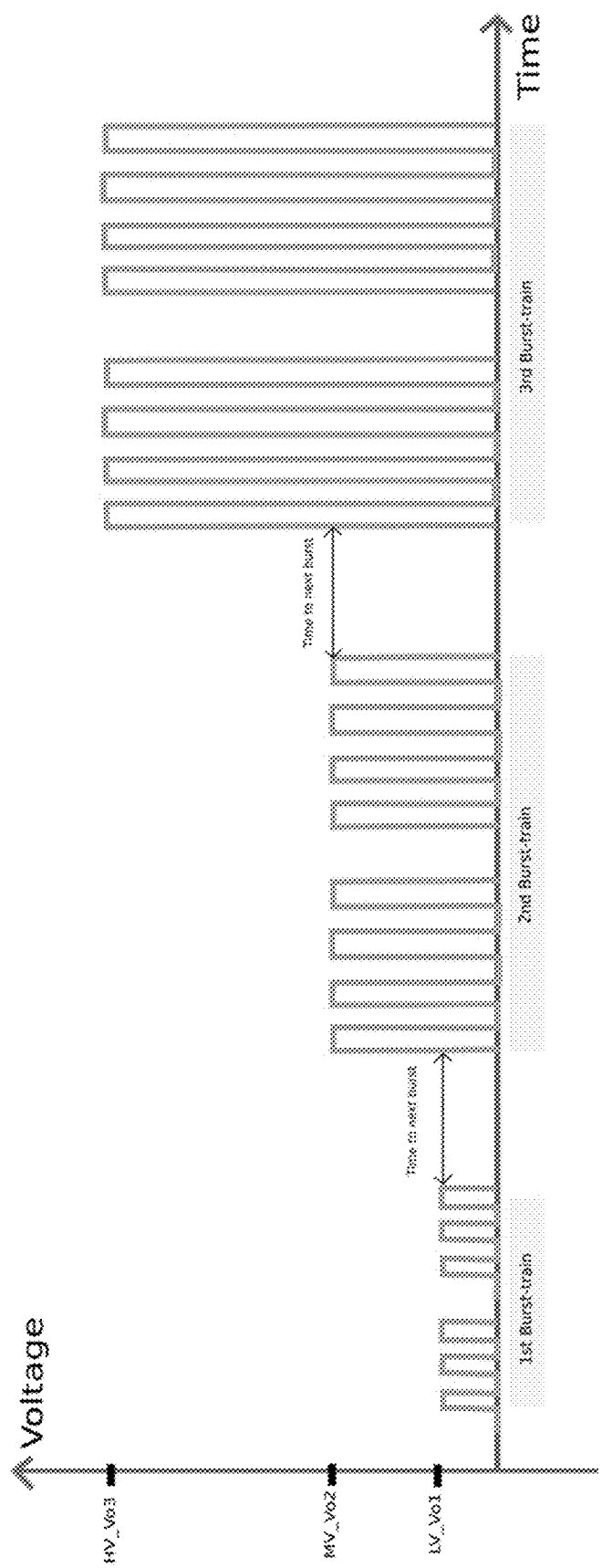
FIG. 11 is a graph illustrating an example of a pulse train that may be achieved with the power supplies disclosed herein.

Referring to FIG. 11, shown is an example of pulsed patterns involving a low voltage, medium voltage, and high voltage output, which the current diversion aspects disclosed herein help to enable. As shown, the PEF power supply may produce short, intense bursts of electric field pulses that are used to apply a high-voltage electric field to various substances or materials for a brief period. PEF generators find application in many fields, including without limitation, the food industry, water and wastewater treatment, biotechnology, and medicine.

In the medical field, PEF generators are of particular use in cancer therapy where RE electroporation can be applied to tumors in combination with previously impermeable anti-cancer drugs, to enable the drugs to cross the cell membrane and induce cell and tumor death. When E-fields higher than about 1 kV/cm are applied to cells, IRE electroporation can be induced. In this case, the applied E-fields are strong enough to damage the cell membrane beyond repair; thus, inducing cell death without application of any drugs. As a consequence, IRE electroporation may be used in medical treatments that require ablation of human tissue. A common example is the use of PEF in pulsed-field ablation (PFA) therapy for cardiac arrhythmia or in treating skin lesions.

The use of a PEF generator to effect electroporation of cancer cells in combination with application of anti-cancer drugs to the cancer cells is sometimes referred to as electrochemotherapy (ECT). ECT is useful for treating skin tumors that are unsuitable for treatment by other methods such as resection.

Figure 12:
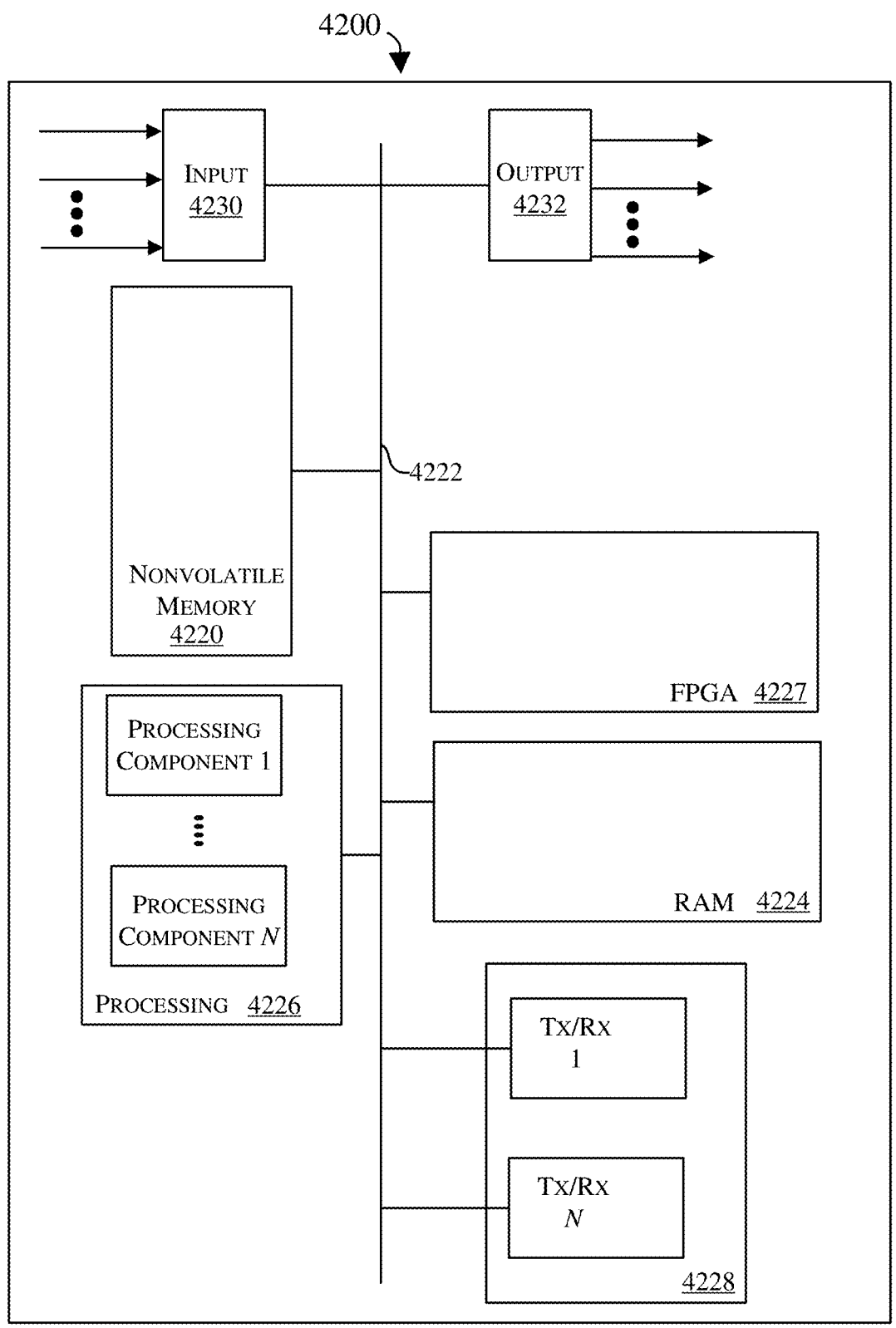
FIG. 12 is a block diagram of a computing system that may be utilized in connection with embodiments disclosed herein.

The methods described in connection with the embodiments disclosed herein may be embodied directly in hardware, in processor-executable code encoded in a non-transitory tangible processor readable storage medium, or in a combination of the two. Referring to FIG. 12 for example, shown is a block diagram 4200 depicting physical components that may be utilized, for example, to realize the controller 220 and/or control circuits described herein.

As shown, bus 4222 is coupled to nonvolatile memory 4220, random access memory ("RAM") 4224, processing portion 4226 that includes N processing components, field programmable gate array (FPGA) 4227, and transceiver component 4228 that includes N transceivers. None of these components are required, and any combination of these may be included in the systems disclosed herein. For instance, where FPGA 4227 is implemented, processing portion 4226 may not be used, and vice versa. Although the components depicted in FIG. 12 represent physical components, FIG. 12 is not intended to be a detailed hardware diagram; thus, many of the components depicted in FIG. 12 may be realized by common constructs or distributed among additional physical components. Moreover, it is contemplated that other existing and yet-to-be developed physical components and architectures may be utilized to implement the functional components described with reference to FIG. 12.

In general, nonvolatile memory 4220 is non-transitory memory that functions to store (e.g., persistently store) data and processor-executable code (including executable code that is associated with effectuating the methods described herein). In some embodiments, nonvolatile memory 4220 includes bootloader code, operating system code, file system code, and non-transitory processor-executable code to facilitate the execution of a method to coordinate operation of power supply 300 as described herein.

In many implementations, nonvolatile memory 4220 is realized by flash memory (e.g., NAND or ONENAND memory), but it is contemplated that other memory types may be utilized as well. Although it may be possible to execute the code from nonvolatile memory 4220, the executable code in the nonvolatile memory is typically loaded into RAM 4224 and executed by one or more of the N processing components in processing portion 4226.

The N processing components in connection with RAM 4224 generally operate to execute the instructions stored in nonvolatile memory 4220 to enable a method for operating power supply components and power supplies disclosed herein. For example, non-transitory, processor-executable code to effectuate the methods described herein may be persistently stored in nonvolatile memory 4220 and executed by the N processing components in connection with RAM 4224. As one of ordinarily skill in the art will appreciate, processing portion 4226 may include a video processor, digital signal processor (DSP), micro-controller, graphics processing unit (GPU), or other hardware processing components or combinations of hardware and software processing components (e.g., an FPGA or an FPGA including digital logic processing portions).

In general, input component 4230 operates to receive one or more analog and/or digital signals (e.g., current and/or voltage signals) and output component 4232 generally operates to provide one or more analog or digital signals. For example, the output component 4232 and non-transitory, processor-executable code may be used to enable an operator of the power supplies to obtain desired pulse-parameters (e.g., by controlling bridge circuitry). As another specific example, the output 4232 may provide the control signals sent to the current diversion components. It is also contemplated that a display may be incorporated with the components depicted in FIG. 12 to provide information about the power applied during operation.

Transceiver component 4228 includes N transceiver chains, which may be used for communicating with external devices via wireless or wireline networks. Each of the N transceiver chains may represent a transceiver associated with a particular communication scheme (e.g., WiFi, Ethernet, Profibus, etc.).

Some portions are presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm is a self-consistent sequence of operations or similar processing leading to a desired result. In this context, operations or processing involves physical manipulation of physical quantities. Typically, although not necessarily, such quantities may take the form of electrical or magnetic signals capable of being stored, transferred, combined, compared, or otherwise manipulated. It has proven convenient at times, principally for reasons of common usage, to refer to such signals as bits, data, values, elements, symbols, characters, terms, numbers, numerals, or the like. It should be understood, however, that all of these and similar terms are to be associated with appropriate physical quantities and are merely convenient labels. Unless specifically stated otherwise, it is appreciated that throughout this specification discussions utilizing terms such as "processing," "computing," "calculating," "determining," and "identifying" or the like refer to actions or processes of a computing device, such as one or more computers or a similar electronic computing device or devices, that manipulate or transform data represented as physical electronic or magnetic quantities within memories, registers, or other information storage devices, transmission devices, or display devices of the computing platform.

As will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

The word "exemplary" as used means "serving as an example, instance, or illustration." Any embodiment described herein as "exemplary" should not be construed as preferred or advantageous over other embodiments.

The flowcharts and block diagrams in the drawing figures illustrate the architecture, functionality, and operation of possible implementations of systems, methods, and computer program products according to various embodiments of this disclosure. In this regard, some blocks in the flowcharts and block diagrams may represent a module, segment, or portion of code, which comprises one or more executable instructions for implementing the specified logical function (s). In some implementations, the functions noted in the block may occur out of the order set forth in the drawings. For example, two blocks shown in succession may, in fact, be executed substantially concurrently, or be executed in the reverse order, depending upon the functionality involved. It will also be understood that each block and combinations of blocks in the flowcharts and block diagrams can be implemented by special purpose hardware-based systems that perform the specified functions or acts, or combinations of special purpose hardware and computer instructions.

Although the terms first, second, third etc. may be used herein to describe various elements, components, regions, layers and/or sections, it will be understood that these elements, components, regions, layers and/or sections are not limited by these terms. These terms are only used to distinguish one element, component, region, layer or section from another region, layer, or section. Thus, a first element, component, region, layer, or section discussed below could be termed a second element, component, region, layer, or section without departing from the teachings of this disclosure.

The terminology used herein is for the purpose of describing particular embodiments only and is not intended to limit this disclosure. As used herein, the singular forms "a," "an," and "the" are intended to include the plural forms as well, unless the context clearly indicates otherwise. The terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes all combinations of one or more of the associated listed items and may be abbreviated as "/".

As used herein, the recitation of "at least one of A, B and C" or "at least one of A, B or C" is intended to mean "either A, B, C or any combination of A, B and C." This description is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the scope of this disclosure is not limited to the embodiments shown herein but is to be accorded the widest scope consistent with the principles and novel features disclosed herein.

The invention claimed is:
1. A power supply component comprising:
a supply node to provide a supply voltage;

at least two supply lines coupled to the supply node, each supply line configured to selectively provide a corresponding source voltage to the supply node, each supply line comprising:
- a corresponding source node that has a corresponding source voltage, wherein each source node provides a voltage that is different from other source nodes;
- a corresponding supply line switch coupled between the corresponding source node and the supply node, the corresponding supply line switch coupling the corresponding source voltage to the supply node when the corresponding supply line switch is closed; and
- a corresponding current diversion component to divert, after a time delay established by timing circuitry, leakage current away from either the corresponding source node or away from the supply node when the corresponding supply line switch is open; and at least one controller configured to:
- close, via a floating driver, one of the switches to select a supply line and corresponding source voltage; and
- disable the current diversion component of the selected supply line; and enable one or more other current diversion components to divert current away from source nodes of one or more supply lines that are not selected.

2. The power supply component of claim 1 wherein the corresponding supply line comprises a collection of two or more series switches.

3. The power supply component of claim 2, wherein the corresponding current diversion component is coupled to a common node between two series switches.

4. The power supply component of claim 3, wherein the corresponding current diversion component is coupled between the common node between two series switches and a ground terminal.

5. The power supply component of claim 1 wherein the supply line switch comprises a collection of two or more series switches.

6. The power supply component of claim 5, wherein at least one of the two or more series switches comprises a field effect transistor.

7. The power supply component of claim 1 comprising:
a bridge circuit coupled to the supply node, the bridge circuit configured to apply a pulsed voltage, wherein a magnitude of the pulsed voltage is controlled by selecting a supply line and corresponding source voltage.

8. The power supply component of claim 1, wherein the source voltage of at least one of the supply lines is at least 200 volts.

9. The power supply component of claim 1, wherein the source voltage of at least one of the supply lines is at least 3000 volts.

10. The power supply component of claim 1, wherein each supply line comprises a capacitor to provide the corresponding source voltage.

11. A method comprising:
- providing a first supply line to couple a first source voltage to a supply node via a first switch;
- providing a second supply line to couple a second source voltage to the supply node via a second switch;
- galvanically isolating the first switch and the second switch from a controller;
- selecting the first source voltage by closing first switch while the second switch is open;
- diverting, while the second switch is open, leakage current away from the second supply line, wherein the diverting is delayed for a time delay after the second switch is open.

12. The method of claim 11 comprising:
- applying the first source voltage to a bridge circuit; and
- producing a pulsed voltage, wherein a magnitude of the pulsed voltage is controlled by selecting the source voltage from among the first and second source voltages.

13. The method of claim 11, wherein the coupling comprises coupling the first source voltage to the supply node via at least two series switches.

14. The method of claim 13, wherein the second switch in the second supply line comprises at least two switches in series and the diverting comprises diverting the leakage current away from a node between two of the switches of the second supply line to a diversion node.

15. The method of claim 14, wherein the diverting comprises diverting leakage current away from the node between two of the switches to a ground terminal.

16. The method of claim 11 comprising:
- providing a first capacitor to provide the first source voltage; and
- providing a second capacitor to provide the second source voltage.

17. The method of claim 16 wherein charging the first capacitor comprises charging the first capacitor to at least 200 volts.

* * * * *